United States Patent [19]

Kessler

[11] Patent Number: 4,516,188
[45] Date of Patent: May 7, 1985

[54] LOGIC CARD

[75] Inventor: Claus Kessler, Berg, Fed. Rep. of Germany

[73] Assignee: Siemens Aktiengesellschaft, Berlin & Munich, Fed. Rep. of Germany

[21] Appl. No.: 526,371

[22] Filed: Aug. 25, 1983

[30] Foreign Application Priority Data

Sep. 30, 1982 [DE] Fed. Rep. of Germany ....... 3236325

[51] Int. Cl.³ .............................................. H01R 9/00
[52] U.S. Cl. ................................. 361/408; 339/17 M; 361/400
[58] Field of Search ................................. 361/400–403, 361/407–409, 395, 397, 399; 339/17 M, 17 N, 17 LM, 17 LL, 18 B, 8 P, 17 R; 174/68.5

[56] References Cited

U.S. PATENT DOCUMENTS 2,779,007 12/1951 Cunningham ..................... 339/18 B
3,539,965 6/1968 Morhart et al. ................... 339/17 M
3,993,123 11/1976 Chu et al. .............................. 165/80
4,277,816 7/1981 Dunn et al. .......................... 361/384

OTHER PUBLICATIONS

IBM Technical Disclosure Bulletin vol. 22 No. 1 (Jun. 1979) pp. 158–159.

Primary Examiner—A. T. Grimley
Assistant Examiner—T. Basma
Attorney, Agent, or Firm—Hill, Van Santen, Steadman & Simpson

[57] ABSTRACT

A logic card comprises a printed circuitboard equipped with integrated modules, a plug connector and a contact pressure component, for example, a cooling device, which exerts a pressure against a surface of the printed circuitboard. In order to prevent sag of the printed circuitboard which could result by the contact pressure component, or to prevent line ruptures and the like caused by plug-in and pulling events, a counterpressure is generated against the printed circuitboard and an elastic connection is produced between the plug connector and the printed circuitboard. To this end, the contacting elements of the plug connector are uniformly, planarly distributed over the printed circuitboard. Each comprises a spring shank for receiving a contact pin and a terminal lug for resiliently pressing against the printed circuitboard.

15 Claims, 2 Drawing Figures

LOGIC CARD

CROSS REFERENCE TO RELATED APPLICATIONS

This application is related to an application Ser. No. 526,403 filed Aug. 25, 1983, and an application Ser. No. 526,375 filed Aug. 24, 1983.

BACKGROUND OF THE INVENTION

1. Field of the Invention

The present invention relates to a logic card comprising a printed circuitboard equipped with electrical modules, a plug connector part having a multitude of contact elements and a contact pressure component, for example, a cooling device which exerts pressure against a surface of a printed circuitboard.

2. Description of the Prior Art

When constructing large electronic systems such as, for example, data processing systems, it is desirable to obtain signal lines which are as short as possible and which have a defined characteristic impedance and, therefore, to achieve high switching speeds. This can be achieved with the assistance of logic cards which exhibit single-layer or multi-layer printed circuitboards having integrated modules and which are connected to a motherboard by way of electrical plugtype connectors. In order to achieve a high conductor density, the motherboard is likewise constructed multi-layer and contains signal lines for connecting components to one another, but also contains potential and supply lines. Given logic cards having maximum packing density, the numerous external terminals required for that purpose are distributed over a smallest space on the underside in order to produce the connections to the printed circuitboard without indirect routes. Known from U.S. Pat. No. 3,993,123, is a logic card having heat-emitting modules which are contacted at one side to a carrier plate. The modules lie beneath a cooling device which surrounds the modules like a cap and proceeding from which one or more resilient parts press a heat-dissipating element against each module. The pressure generated is diverted to the edges of the plate which are flanged to the cooling device, whereby, however, the carrier can experience sag.

Since a large number of vertically-projecting plug pins is also secured to the carrier plate, a sag complicates plug-in and pulling of the logic card, this, as known, requiring pins which are aligned exactly parallel relative to one another. Otherwise, the danger exists that pins will be bent or broken off and, as a result thereof, that faulty connections will arise or that, at the very least, even greater plug-in and pulling forces will be required than would otherwise be necessary anyway because of the large number of connections. Moreover, the danger exists, given a printed circuitboard yielding to a mechanical stress, that fine cracks will arise in the affected conductor paths and will interrupt the connections. This situation is all the more likely to occur when the pins are rigidly connected to the printed circuitboard and the already-existing excursion, given frequent change of the logic card, is increased, on the one hand, by pulling forces and, on the other hand, is restored due to the elasticity of the printed circuitboard, this potentially leading to fatigue of the conductor path material.

SUMMARY OF THE INVENTION

It is therefore the object of the present invention to provide a logic card of the type generally set forth above which is provided with a plug connector part in such a manner that sources of error resulting from plug-in and pulling events are reduced.

The foregoing object is achieved, according to the present invention, in that the contacting surfaces are disposed in a uniform distribution on that side of the printed circuitboard lying opposite the contact pressure components; in that the plug connector part extends over this entire lateral surface; and in that it exhibits passages for the contact elements above the contacting surfaces. The contact elements respectively comprise a spring shank and a terminal lug designed as a compression spring for pressing against the contacting surfaces under spring tension. In this manner, no one-sided pressure forces influence the printed circuitboard so that no sag occurs. The counterpressure against the printed circuitboard is pre-adjustable by selecting the spring value of the terminal lugs. Since, moreover, the contact elements are not rigidly connected to the printed circuitboard, the forces occurring upon plug-in and pulling do not lead to an excursion of the printed circuitboard. As a result thereof, the cracks and fractures in the conductive paths or in solder connections which occur from a static or dynamic force influence are prevented.

According to a feature of the invention, the terminal lugs are designed as curved leaf springs. When the terminal lugs are rigidly connected to the contacting surfaces, the contacting reliability is increased and this can be further improved in that the spring shanks respectively comprise three lateral portions connected U-shaped to one another and forming a receiving channel for a contact pin and in that at least one of the U-legs comprises a resilient section for pressing against the contact pin.

The spring shanks of the contact elements are advantageously respectively fixed in the passages of the plug connector portion by a snap-in latch. When the terminal lugs are designed regarding their dimensions such that the overall contact element can be plugged into a passage, then an assignment of connecting elements and terminal surfaces can be selectively undertaken for different logic cards.

According to further features of the invention, the printed circuitboard is fitted into a first recess of the plug connector and the contact pressure component is fitted into the plug connector in a second recess parallel to the printed circuitboard. This leads to a compact structure of the logic card and, in addition, has the advantage that the overall logic card is enclosed by the plug connector so that the connector absorbs all forces during plugging-in and pulling operations.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
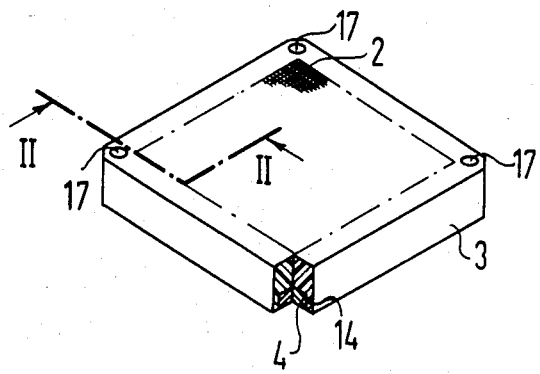
FIG. 1 is a perspective view of a logic card constructed in accordance with the present invention.
Figure 2:
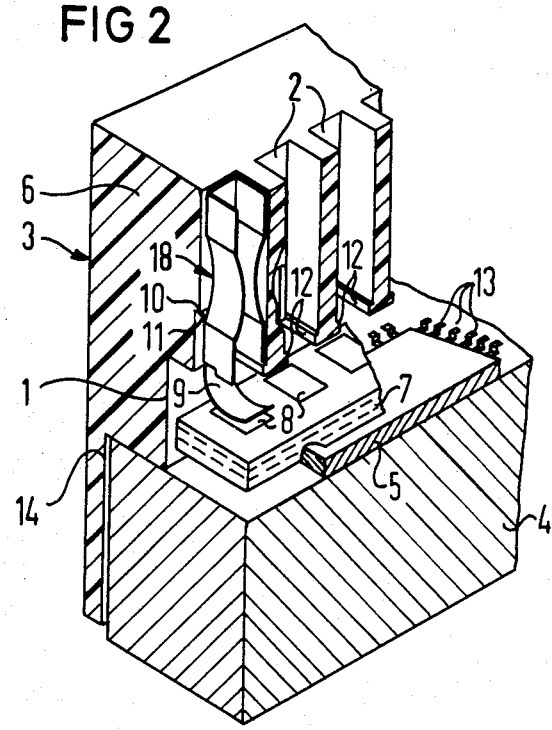
FIG. 2 is a sectional view of the logic card of FIG. 1 taken generally along the parting line II—II.

Referring to FIG. 1, a logic card is illustrated and has its external shape determined by a plate-like plug connector 3 which is provided with a first recess 1 and a second recess 14 (see FIG. 2) opening towards one of the flat sides for receiving a printed circuitboard 7 or, respectively, a contact pressure component 4 secured with screw-type connections 17. This, for example, can comprise a metal plate which serves as a cooling device for the heat-emitting components of the logic card. In the area of the first recess 1, in its base 6, the plug connector 3 comprises a multitude of rectangular passages 2 for receiving contact elements 9, 18 distributed grid-like in a matrix or an array and forms an enclosure of the logic card, together with a collar arising due to the recesses 1 and 14. FIG. 2 is a sectional view through the logic card, as mentioned above, along the parting line II—II of FIG. 1. A contact element 9, 18 comprises a spring shank 18 and a terminal 9 designed as compression spring, the contact being secured in a passage 2 with a snap-in latch. The spring shank 18 comprises three lateral portions connected U-shaped to one another and forming a receiving channel for a contact pin (not illustrated), whereby the two legs of the U exhibit arced, resilient center sections constricting the receiving channel in a funnel-like manner. Given reception of the contact pin, the resilient center sections generate a double contact pressure contact. The legs of the U are seated on first ledges 12 below the openings of the passages 2. For latching the contact element 9, 18, a tongue 11, directed towards the outside opening of the respective passage 2 spreads away from the spring shank 18, the tongue 11 being engaged in the passage 2 behind a second ledge 10.

The terminal lug 9 comprises a curved leaf spring whose radius of curvature and leaf width are dimensioned such that the overall contact elements 9, 18 can be plugged into a passage 2. The leaves are therefore no wider than the passage 2 and the diameter of curvature approximately corresponds to the length of the passage 2, whereby it is to be taken into consideration that the diameter of curvature can be reduced under pressure. The free end of the leaf spring projects into the first recess 1 and produces a perpendicularly effective spring pressure on the printed circuitboard 7 which is accurately fitted therein with respect to its side edges.

Etched onto the printed circuitboard below the passages 2 and uniformly distributed in accordance with the aforementioned spacing, are contacting surfaces 8 against which the terminal lug 9 press. The terminal lugs 9 can also be rigidly connected hereto by way of solder. A multitude of integrated micromodules 5, of which one is illustrated, are contacted to the side lying opposite the contacting surfaces 8, by way of terminal wires 13, the contacting being by way of a film assembly technique. A number of layers of etched conductive paths extend in the printed circuitboard 7 for the purpose of connecting these to one another and to the contacting surfaces 8.

A pressure is exerted on the micromodules 5 by way of a contact pressure component 4 in order, for example, to generate a good thermal contact, the force being transmitted to the printed circuitboard 7 and potentially leading to sag if it were not canceled by the spring pressure of the terminal lugs. A sufficient and uniform force between the terminal lugs 9 and the contacting surfaces 8 is achieved in that the terminal lugs 9 are over-elongated before assembly. The terminal lugs 9 or,respectively, the contact elements 9, 18 are thereby distributed in such a manner that a uniform pressure against the printed circuitboard 7 is produced. An elastic connection between the plug connector 3 and the printed circuitboard 7 is also produced in this manner.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A logic card and an electrical connector, in combination comprising:
    a logic card comprising a printed circuitboard including first and second surfaces, said first surface including contact pads, said second surface adapted for contact to at least one micromodule, and conductors within said logic card extending between said pads and said second surface; and
    an electrical connector comprising a connector body, surfaces defining first and second recesses in said body, passage means defining a plurality of passages through said body in communication between said first recess and the exterior of said body, a plurality of contacts each in a respective one of said passages and each including a resilient section, said printed circuitboard disposed in said first recess with said pads aligned with said passages and bearing against respective resilient sections of said contacts, and pressure means in said second recess for contacting the micromodule on said second surface of said printed circuitboard and urging said contact pads against said resilient sections.

2. The combination of claim 1, wherein:
    each of said resilient sections comprises an arcuate leaf spring.

3. The combination of claim 1, wherein:
    each of said contacts comprises a solder connection of said resilient section to said contact pad.

4. The combination of claim 1, wherein:
    each of said contacts comprises a U-shaped section connected to said resilient section.

5. The combination of claim 1, wherein:
    each of said passages comprises a ledge; and
    each of said contacts comprises a tongue for snap-in retention behind said ledge.

6. The combination of claim 1, wherein:
    each of said contacts comprises a length fully received in the respective passage with said resilient section flexible to contact the respective pad.

7. The combination of claim 1, wherein:
    said pressure means comprises a pressure member secured to said body.

8. A logic card, an electrical connector and a contact pressure component in combination comprising:
    a logic card comprising a printed circuitboard including first and second surfaces, said first surface including a plurality of contact pads in a uniform distribution, said second surface adapted for contact to at least one micromodule, and conductors within said logic card extending between said pads and said second surface;

an electrical connector comprising a connector body, extending over said entire first surface of said logic card, passage means defining a plurality of passages through said body, said printed circuitboard disposed with said pads aligned with said passages, and a plurality of contacts each in a respective one of said passages and each including a resilient section bearing against a respective contact pad;

and a pressure component for contacting the micromodule and urging the same against said second surface of said logic card and thus said logic card against said resilient sections of said contacts.

9. The combination of claim 8, wherein:

each of said resilient sections comprises an arcuate leaf spring.

10. The combination of claim 9, wherein:

each of said arcuate leafs comprises a dimension such that each of said contacts can be plugged into the respective passage.

11. The combination of claim 8, wherein:

each of said contacts comprises a solder connection of said resilient section to said contact pad.

12. The combination of claim 8, wherein:

each of said contacts comprises three lateral portions connected U-shaped to one another and forming a receiving channel for a contact pin, whereby at least one of the U-shaped legs exhibits an arcuate, resilient center section.

13. The combination of claim 8, wherein:

each of said passages comprises a ledge; and each of said contacts comprises a tongue for snap-in retention behind said ledge.

14. The combination of claim 8, wherein:

said electrical connector body comprises a surface defining a recess for receiving siad logic card.

15. The combination of claim 8, wherein:

said electrical connector body comprises a surface defining a recess for receiving said contact pressure component.

* * * * *